(12) United States Patent
Hynecek

(10) Patent No.: US 7,190,400 B2
(45) Date of Patent: *Mar. 13, 2007

(54) CHARGE MULTIPLIER WITH LOGARITHMIC DYNAMIC RANGE COMPRESSION IMPLEMENTED IN CHARGE DOMAIN

(75) Inventor: Jaroslav Hynecek, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 916 days.

This patent is subject to a terminal disclaimer.

(21) Appl. No.: 10/140,406

(22) Filed: May 6, 2002

(65) Prior Publication Data

US 2002/0191093 A1 Dec. 19, 2002

Related U.S. Application Data

(60) Provisional application No. 60/295,424, filed on Jun. 4, 2001.

(51) Int. Cl.
 *H04N 3/14* (2006.01)
 *H04N 5/335* (2006.01)

(52) U.S. Cl. .................. 348/317; 348/314; 348/315
(58) Field of Classification Search ............ 348/216.1, 348/217.1, 303, 314, 315, 248–249, 250, 348/324; 250/208.1
See application file for complete search history.

(56) References Cited

U.S. PATENT DOCUMENTS 5,867,215 A * 2/1999 Kaplan ....................... 348/315
6,444,968 B1 * 9/2002 Burt et al. ................ 250/208.1

* cited by examiner

*Primary Examiner*—Ngoc-Yen Vu
(74) *Attorney, Agent, or Firm*—Alan K. Stewart; W. James Brady; Frederick J. Telecky, Jr.

(57) ABSTRACT

A CCD device incorporates Charge Multiplication in its CCD registers together with charge domain Dynamic Range compression. This structure preserves the high dynamic range available in the charge domain of these devices, and avoids limiting it by an inadequate voltage swing of the charge detection nodes and amplifiers. The Dynamic Range compression is logarithmic from a predetermined built in threshold and noiseless. The technique has an additional advantage of maintaining the compact size of the registers, and the registers may also include antiblooming devices to prevent blooming.

11 Claims, 4 Drawing Sheets

CHARGE MULTIPLIER WITH LOGARITHMIC DYNAMIC RANGE COMPRESSION IMPLEMENTED IN CHARGE DOMAIN

Priority is claimed from Provisional Application Ser. No. 60/295,424, filed Jun. 4, 2001.

FIELD OF THE INVENTION

The present invention relates to solid-state image sensors, and more specifically to image sensors that incorporate a Charge Multiplier (CM) in their structure.

BACKGROUND OF THE INVENTION

A typical image sensor senses light by converting impinging photons into electrons that are integrated (collected) in sensor pixels. After the integration cycle is completed, charge is converted into a voltage that is supplied to the output terminals of the device. The charge to voltage conversion is accomplished either directly in the sensor pixels, such as in the Active Pixel CMOS image sensors, or remotely off the sensing area in charge conversion amplifiers. In the remote conversion process, charge must be transported to the sensing amplifier by a well know charge transferring process using various vertical and horizontal Charge Coupled Device (CCD) registers.

U.S. Pat. No. 5,337,340 teaches the basic concept of charge carrier multiplication that can be used in a typical CCD register. The multiplication is based on a single carrier impact ionization that is induced by the application of suitable clocking voltages to the various device gates. The suitable clocking voltages generate high fields in the structure, and when a carrier is injected into these high field regions, it gains energy and may cause impact ionization. This process thus increases the original number of carriers that arrive at the charge detection amplifier. This is a desirable effect, since the carrier multiplication that is based on single carrier impact ionization is almost noiseless. It is much easier to detect many electrons per single received photon than a single electron by the current state of the art charge detection amplifiers. The noise floor of the present day charge conversion amplifiers is approximately 10 electrons, and cannot be easily reduced.

The charge multiplication, however, presents a problem for the design of the CCD registers. As the number of transported carriers gradually increases, larger and larger wells have to be used. This may not be easily accomplished in the registers that are restricted in both dimensions by the sensor pixel size. Examples are the vertical registers in Frame Transfer (FT) sensors, Time Delay Integrate (TDI) sensors, or Interline Transfer (IT) sensors. It is thus desirable to incorporate most of the charge multiplication function into the horizontal CCD registers whose width is restricted in only one dimension.

A second problem resulting from the charge multiplication is related to the DR of the charge conversion structures at the input of the charge detection amplifiers.

Typically, charge is transferred on a suitable charge detection node whose capacitance converts arrived charge into an increment of voltage. It is desirable to have a high sensitivity and low noise for the charge conversion. This dictates a very small value for the node capacitance. However, when charge is multiplied, the voltage increment may be so large that the detection node cannot handle it. The available maximum voltage swing thus undesirably limits the DR of the sensor.

To avoid these problems it is therefore advantageous to compress the DR directly in the charge domain before charge conversion into a voltage and at the same time eliminate the need for the gradual size increase of the register wells.

Hynecek presents one possible solution to these problems in a [provisional] patent application [60/200,255]. As shown in FIG. 1, the CCD area image sensor 100 has an image sensing area 101 and an extended serial register 102 connected to the charge multiplication region of variable width 103. A charge overflow region 104 then supplies charge into at least two outputs 105 and 106 with a different conversion gain that are finally combined into one output 107. The resulting device has a piece-wise linear transfer characteristic, which accomplishes DR compression and avoids saturation of the output charge detection nodes. While this solution is useful it has drawbacks of consuming larger chip area, the piece wise transfer characteristic has a limited range of usefulness, and combining the outputs together after charge has been converted into a voltage increases noise.

It is the purpose of this invention to teach how to overcome limitations of the prior art, and how to achieve high DR readout capability with low noise. The prior art does not show in detail how to incorporate the charge multiplier into a serial register and combine it with the DR compression in each cell to avoid the need for the gradual register well size increase and the saturation of the output charge detection node. The prior art also does not teach how to design the DR compression structure that has, instead of the piece-wise linear characteristic, a superior logarithmic nonlinear transfer characteristic.

SUMMARY OF THE INVENTION

The invention is related to image sensors that incorporate a Charge Multiplier (CM) into their structure. The CM significantly extends the charge domain Dynamic Range (DR) of the sensor thus increasing the demand on the DR of charge readout systems. The invention, therefore, relates to the design of the readout architectures with the charge domain DR compression for the sensors that incorporate charge multipliers and have high charge domain DR with large charge handling capabilities.

It is an object of the present invention to overcome limitations in the prior art. It is a further object of the present invention to provide a practical high DR readout system whose DR is not restricted by the voltage swing limitations on the charge detection node.

It is yet another object of the invention to provide a practical high performance image sensors of various architectures that have high DR. These and other objects are achieved by incorporating Charge Multiplier cells into a horizontal register of a CCD image sensor and combine them with the DR compression mechanism. As charge is multiplied the horizontal register would normally have to be increased in width to accommodate more charge and have larger or more charge multiplication gates per stage. This is avoided if the charge overflow region is incorporated into the same cells with the charge multiplier.

As charge is multiplied to a predetermined threshold level the amount of charge exceeding that threshold is split off into an adjacent overflow CCD register. The adjacent register, which does not include the charge multiplication gates, then transports the overflow charge to the output. At the end of the registers charge from both registers may be combined together and transported onto a single charge detection node.

As a result of this design, the charge to voltage transfer characteristic is linear for a multiplied amount of charge that does not exceed the threshold and logarithmically compressed for the amount of charge that exceeds the threshold. The charge multiplication structure that is compact in size and that combines both the linear and the logarithmically compressed transfer characteristics is very advantageous, since it allows using the standard charge detection nodes that have high charge to voltage conversion gain and low noise. Since the charge DR is compressed the charge detection node is not limiting the sensor DR by the available maximum output voltage swing.

BRIEF DESCRIPTION OF THE DRAWINGS

The invention will be described in detail in the following description of preferred embodiments with reference to the following figures wherein.

DESCRIPTION OF PREFERRED EMBODIMENT

Figure 1:
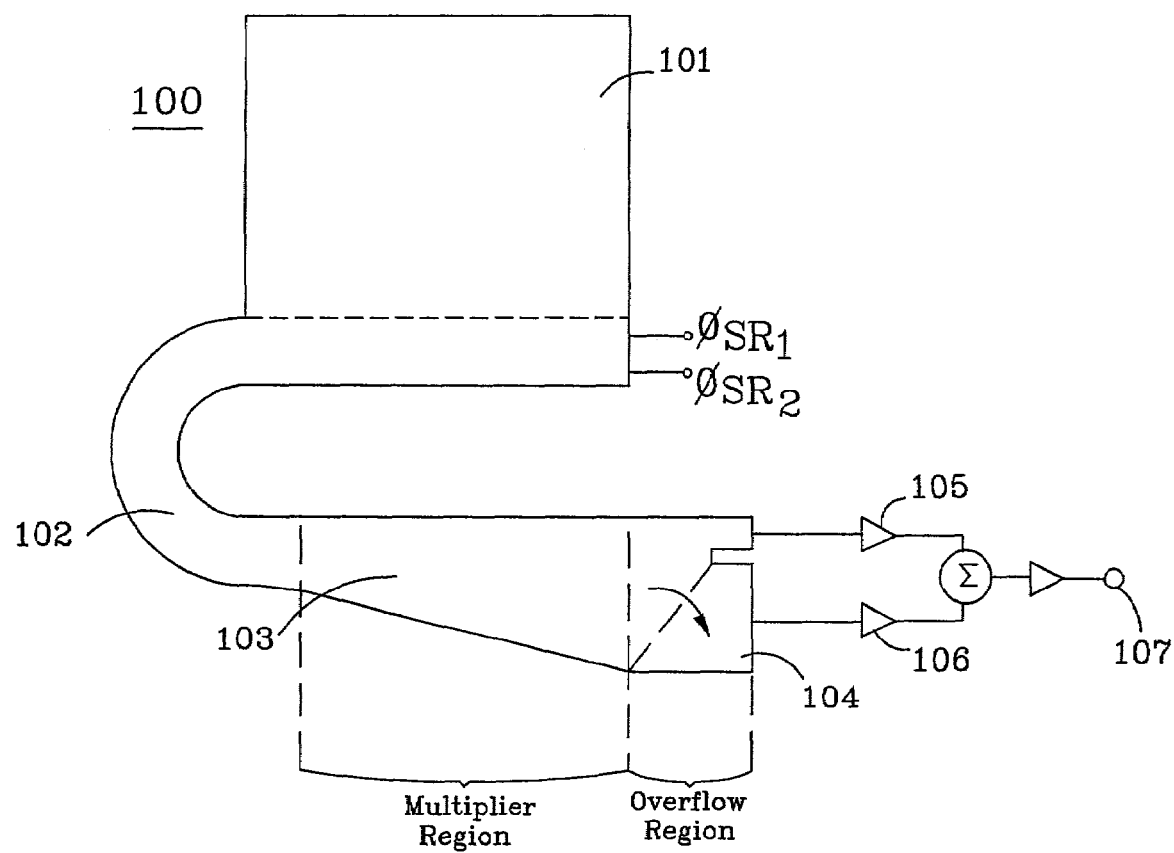
FIG. 1 is a plan view of the typical prior art area image sensor showing the extended serial register that couples to the charge multiplier, which has a gradually increasing cell widths, the charge overflow region, and two outputs with generally different conversion gains that are combined into one.
Figure 2:
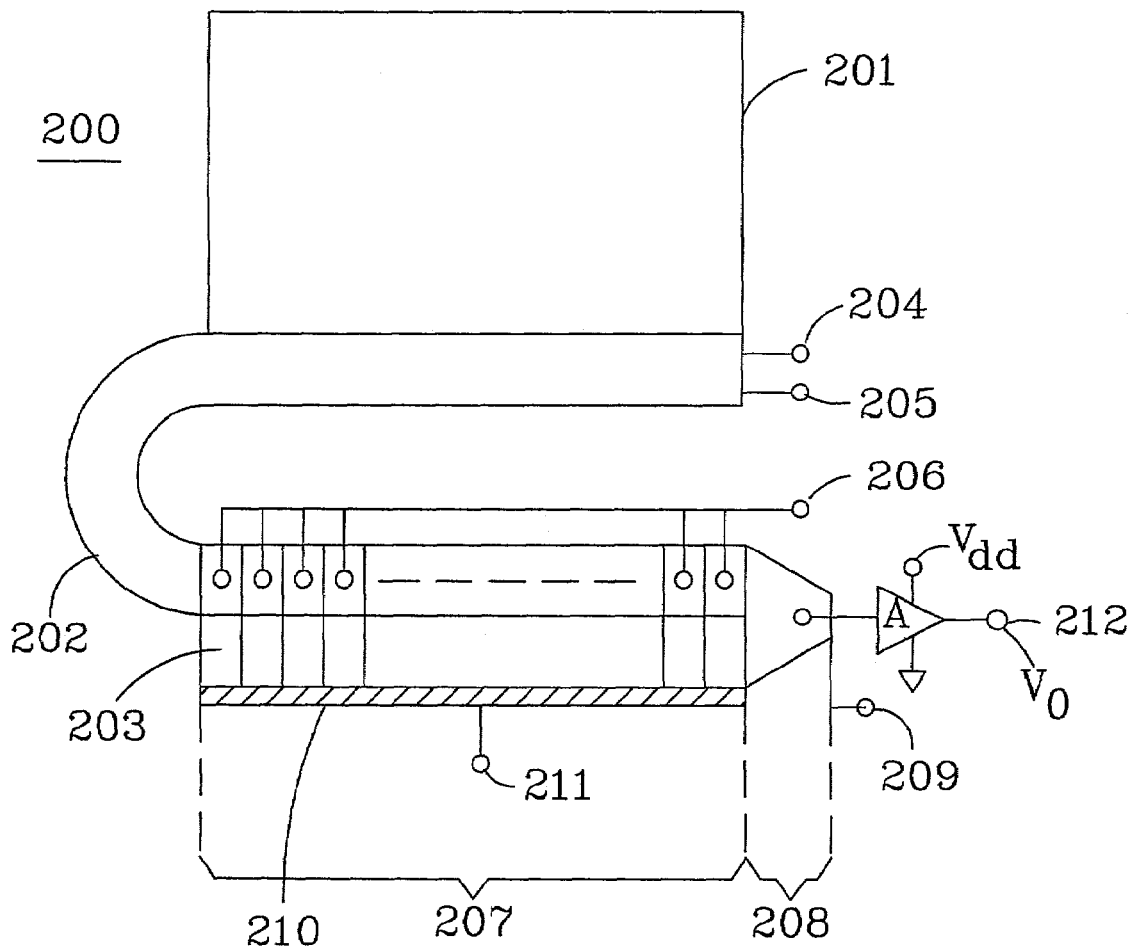
FIG. 2 is a plan view of the image sensor of the present invention that has an extended serial register that couples to the charge multiplier section that has a constant width, and the multiplier cells include an overflow barrier and an adjacent overflow register cells for transporting overflow charge.

FIG. 2 shows a plan view of the CCD area image sensor 200 of the present invention. The sensor consists of an image sensing area 201 that interfaces with the extended serial register 202. Two-phase clocks applied to the terminal 204 and 205 clock serial register 202. The extended register 202 is coupled to the charge multiplication region 207 that consists of specially designed charge multiplication cells 203. The same clocks also clock this register, but additional charge multiplication gate is added that is clocked through the terminal 206. The charge multiplication region 207 essentially consists of two adjacent CCD registers coupled together in each cell by a charge overflow barrier. The charge summing and the charge detection node 208 that is reset by the reset clock applied to the terminal 209 terminates the multiplication region. The detected signal is buffered by an amplifier A, and delivered to the device output terminal 212. An antiblooming structure 210 may be included in the charge multiplication region and connected to a suitable bias through the terminal 211.

The operation of the DR compression can be understood from the following considerations: Assuming that a small number of charge carriers $n_i$ are input into the multiplication region. The number of carriers will gradually increase until the $K^{th}$ cell where it reaches the well size limit FW. From this point on, any multiplied carriers will spill over to the overflow regions. The number of the overflow carriers at the end of the overflow register will be: $(N-K)*(A-1)*FW$, where N is the number of multiplication stages in the register, and A is the multiplication gain per cell. By finding K for a given $n_i$, it is possible to write the following expression for the output, providing that the FW threshold has been reached:

$$V_o = S*FW*(A-1)*\{N - ln(FW)/ln(A) + ln(n_i)/ln(A)\}, \quad (1)$$

where S is the carrier to voltage conversion factor. From this expression it is observed that the output depends on the input logarithmically. For the case of the input, when the threshold has not been reached, the output is: $V_o = S*A^{N}*n_i$, a simple linear dependency as expected.

Figure 4:
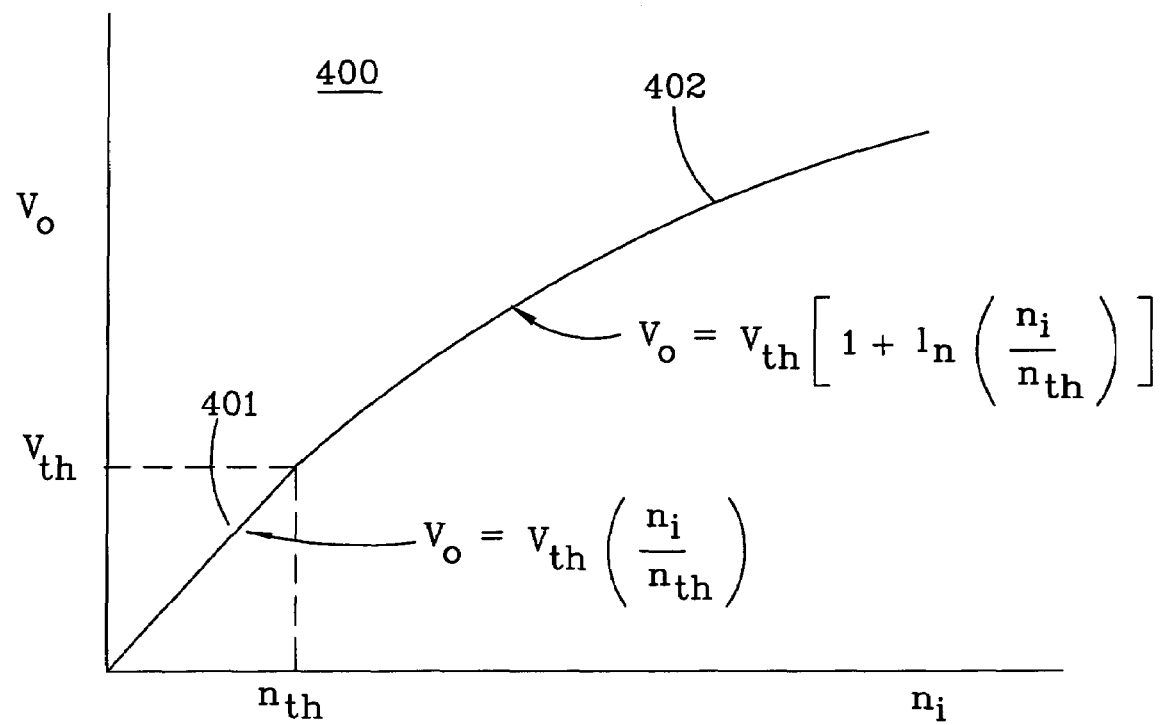
FIG. 4 shows a typical transfer function for the device of the present invention where the transfer function is linear up to a threshold $V_{th}$ and then continues with the logarithmic dependency.

Graph 400, of the output $V_o$, versus the input number of carriers, is shown in FIG. 4. The graph consists of a linear portion 401, $V_0 = V_{th}(n_i/n_{th})$, up to a threshold $V_{th}$ and continues with a logarithmic dependency 402, $V_0 = V_{th}[1 + l_n( n_i/n_{th})]$. The sections are joined smoothly with a common first derivative. The logarithmic dependency provides the desired charge domain DR compression that prevents the saturation of the output charge detection node.

Figure 3:
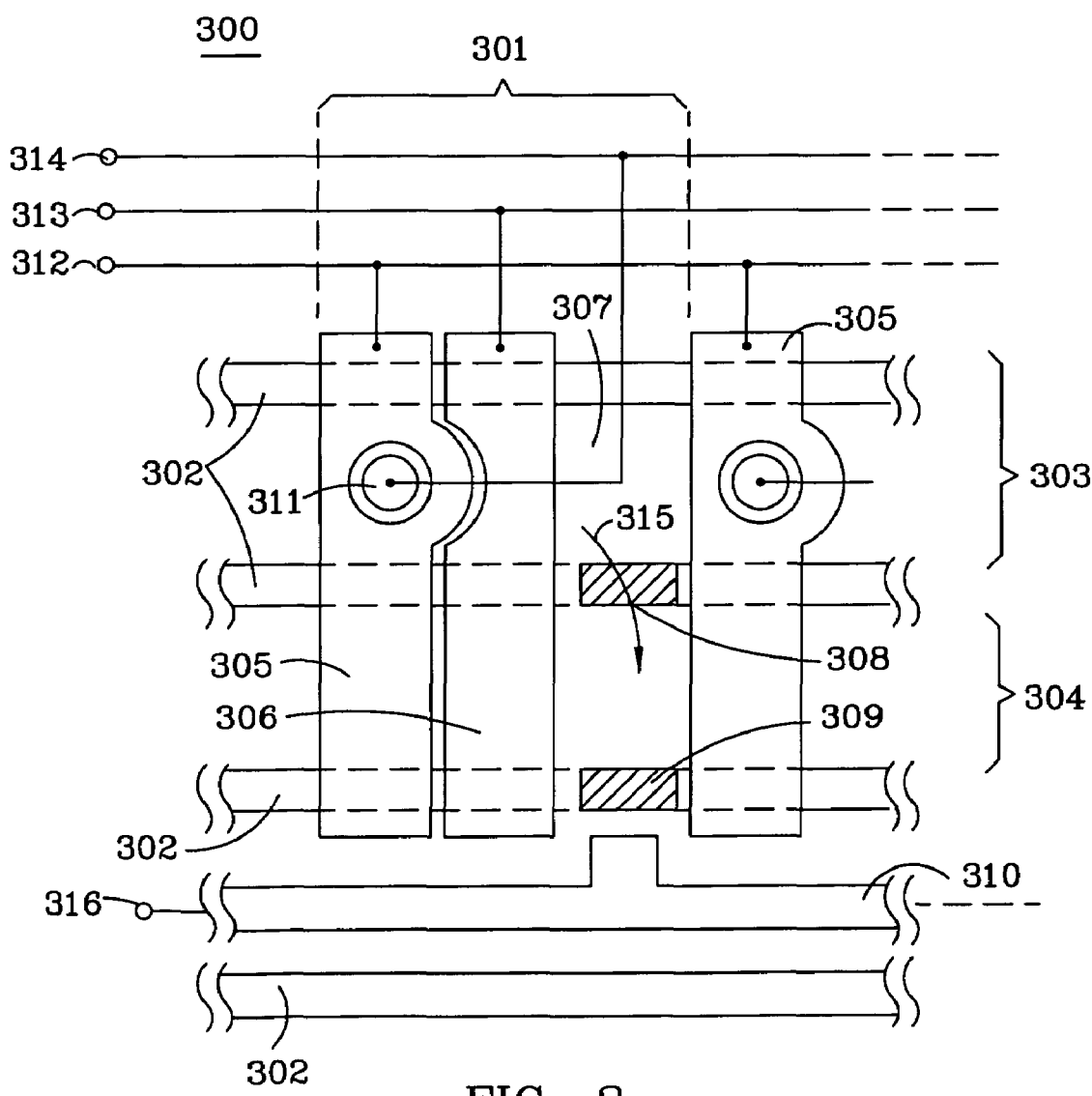
FIG. 3 is a detail drawing of the charge multiplier cell with an overflow region and an adjacent overflow register cell, the overflow register cell including an antiblooming barrier and an antiblooming drain to prevent charge blooming along the direction of charge transport.

A detail drawing of the charge multiplication cell 300 with the charge overflow function is shown in FIG. 3. The cell consist of a region 301 that is further divided in a horizontal direction Into clocked gates 305, 306, and a virtual gate 307.

The cell is divided in the vertical direction into two CCD channels 303 and 304 that are separated and bounded by channel stops 302. The channel 303 is the charge multiplication channel that includes the multiplication gates 311. The charge overflow region 308 is placed in one of the channel stop 302 that is common to both channels.

When charge in the multiplication channel 303 exceeds a certain limit, the charge excess 315 overflows into the channel 304. Charge in both channels 303,304 travels synchronously toward the output transported by the same clocking signals applied to the terminals 312 and 313. When too much charge accumulates in the overflow channel 304, it spills over the antiblooming barrier 309 into the antiblooming drain 310. This prevents undesirable charge blooming along the transport direction of the register. The antiblooming drain 310 is biased at a suitable DC bias through the terminal 316. Charge from both channels 303,304 are summed together at the detection node, or just prior to it in a special CCD cell. Charge in both channels can also be detected separately. These techniques are common it the art and does not need to be discussed here in any more detail.

The optimum number of cells used in the register and the register orientation on the semiconductor substrate is important for the device gain and noise. Certain orientations improve impact ionization gain, other reduce noise. It is therefore advantageous to use certain orientations depending upon application. The details of implementation of these and other techniques are well known in the art, and therefore do not need to be discussed here.

Any type of the charge detection and signal-buffering device can be used with this invention. Standard Floating Diffusion, Floating Gate, or BCD charge detection amplifiers are suitable and well known to those skilled in the art. It is important to note, however, that the detection node will not be saturated since the charge DR has been logarithmically compressed as explained previously. This is one advantage of the present invention. The second important advantage is that the signal summing is performed in charge domain, which is a noiseless process. Finally, the third important advantage is that the register maintains a compact size without increasing the width.

Having described preferred embodiments of a novel semiconductor image sensor with high DR readout and low noise, which are intended to be illustrative and not limiting, it is noted that modifications and variations can be made by persons skilled in the art in light of the above teachings. It is therefore to be understood that changes may be made in the particular embodiments of the invention disclosed which are within the scope and spirit of the invention as defined by the appended claims.

Having thus described the invention with the details and particularity required by the patent laws, what is claimed and desired protected by Letters Patent is set forth in the appended claims.

What is claimed:

1. A CCD register solid-state image sensor incorporating a Charge Multiplier in its structure, comprising:
    at least one CCD charge multiplication cell adjacent to a CCD register cell, and coupled to said register cell through a charge overflow barrier, wherein adjacent and coupled CCD register cells collect overflow charge from multiplying register cells, and transport charge synchronously in parallel with remaining charge in the multiplying register cells to neighboring cells of the register.

2. The CCD register structure according to claim 1, including at least one charge multiplication cell coupled to at least one overflow charge collection cell, the register structure being terminated with a charge-summing cell that sums charge from the charge multiplying cells with charge from the overflow charge collection cells.

3. The CCD register according to claim 1, wherein the charge-summing cell is a charge detection node coupled to a buffer amplifier for the purpose of sensing the amount of charge.

4. The CCD register according to claim 1, that contains a number of cells not less then 20 and not more than 5000.

5. The CCD register according to claim 1, including an antiblooming barrier and antiblooming drain added to at least one overflow charge collection cell to prevent blooming.

6. The CCD register solid-state image sensor incorporating a charge Multiplier in its structure, comprising:
    at least one CCD charge multiplication cell adjacent to a CCD register cell, and coupled to the said register cell through a charge overflow barrier.
    wherein adjacent and coupled CCD register cells collect overflow charge from multiplying register cells, and transport charge synchronously in parallel with remaining charge in the multiplying register cells to neighboring cells of the register.

7. The CCD register structure according to claim 6, including at least one charge multiplication cell coupled to at least one overflow charge collection cell, the register structure being terminated with a charge-summing cell that sums charge from the charge multiplying cells with charge from the overflow charge collection cells.

8. The CCD register according to claim 7, wherein the charge-summing cell is a charge detection node coupled to a buffer amplifier for the purpose of sensing the amount of charge.

9. The CCD register according to claim 7, including an antiblooming barrier and antiblooming drain added to at least one overflow charge collection cell to prevent blooming.

10. The CCD register according to claim 6, that contains a number of cells not less then 20 and not more than 5000.

11. A CCD register solid-state image sensor incorporating a charge Multiplier in its structure, comprising:
    at least one CCD charge multiplication cell adjacent to a CCD register cell, and coupled to the said register cell through a charge overflow barrier;
    wherein adjacent and coupled CCD register cells collect overflow charge from multiplying register cells, and transports charge synchronously in parallel with remaining charge in the multiplying register cells to neighboring cells of the register; and
    said at least one charge multiplication cell is coupled to at least one overflow charge collection cell, the register structure being terminated with a charge-summing cell that sums charge from the charge multiplying cells with charge from the overflow charge from collection cells.

* * * * *